(12) United States Patent
Bai et al.

(10) Patent No.: US 12,557,304 B2
(45) Date of Patent: Feb. 17, 2026

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Jie Bai, Hefei (CN); Kang You, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 496 days.

(21) Appl. No.: 18/149,225

(22) Filed: Jan. 3, 2023

(65) Prior Publication Data

US 2023/0223432 A1   Jul. 13, 2023

(30) Foreign Application Priority Data

Jan. 11, 2022   (CN) .......................... 202210026775.0

(51) Int. Cl.
| | |
|---|---|
| *H10N 70/00* | (2023.01) |
| *H01L 21/762* | (2006.01) |
| *H10D 1/00* | (2025.01) |
| *H10D 1/68* | (2025.01) |
| *H10B 12/00* | (2023.01) |

(52) U.S. Cl.
CPC ....... *H10D 1/043* (2025.01); *H01L 21/76224* (2013.01); *H10D 1/716* (2025.01); *H10B 12/033* (2023.02); *H10B 12/315* (2023.02)

(58) Field of Classification Search
CPC .... H10B 12/033; H10B 12/315; H10D 1/716; H10D 1/042; H10D 1/043; H10D 1/692
See application file for complete search history.

(56) References Cited

U.S. PATENT DOCUMENTS

| | | | |
|---|---|---|---|
| 9,349,789 B1 * | 5/2016 | Vega | H10B 12/0387 |
| 2019/0214455 A1 * | 7/2019 | Kang | H10D 1/042 |

FOREIGN PATENT DOCUMENTS

CN          202013811 U          10/2011

* cited by examiner

*Primary Examiner* — John A Bodnar
(74) *Attorney, Agent, or Firm* — Kilpatrick Townsend & Stockton LLP

(57) ABSTRACT

The present disclosure provides a method of manufacturing a semiconductor structure and a semiconductor structure. The method includes: providing a base; forming a plurality of support layers on the base, where the support layers are configured to support a plate capacitor structure, extend along a first direction, and are arranged at intervals along a second direction, and the first direction intersects the second direction; forming a bottom electrode layer, where the bottom electrode layer at least covers sidewalls of the support layers; and forming a dielectric layer, the dielectric layer covering the bottom electrode layer.

8 Claims, 13 Drawing Sheets

METHOD OF MANUFACTURING SEMICONDUCTOR STRUCTURE AND SEMICONDUCTOR STRUCTURE

CROSS-REFERENCE TO RELATED APPLICATION

This application claims the priority of Chinese Patent Application No. 202210026775.0, submitted to the Chinese Intellectual Property Office on Jan. 11, 2022, the disclosure of which is incorporated herein in its entirety by reference.

TECHNICAL FIELD

The present disclosure relates to the technical field of semiconductors, and in particular, to a method of manufacturing a semiconductor structure and a semiconductor structure.

BACKGROUND

The dynamic random access memory (DRAM) features a small size, a high integration, and low power consumption, and is faster than the read only memory (ROM). As the integration level increases, the size of DRAM continues to shrink, and the aspect ratio of the capacitor also becomes increasingly high, which, thus, brings increasingly high challenges to the capacitor manufacturing method.

SUMMARY

An overview of the subject described in detail in the present disclosure is provided below. This overview is not intended to limit the protection scope of the claims.

The present disclosure provides a method of manufacturing a semiconductor structure and a semiconductor structure.

A first aspect of the present disclosure provides a method of manufacturing a semiconductor structure, where the method includes:
  providing a base;
  forming a plurality of support layers on the base, where the support layers are configured to support a plate capacitor structure, extend along a first direction, and are arranged at intervals along a second direction, and the first direction intersects the second direction;
  forming a bottom electrode layer, where the bottom electrode layer at least covers sidewalls of the support layers; and
  forming a dielectric layer, the dielectric layer covering the bottom electrode layer.

A second aspect of the present disclosure provides a semiconductor structure, where the semiconductor structure includes:
  a base;
  a plurality of support layers configured to support a plate capacitor structure, where the support layers are disposed on the base, extend along a first direction, and are arranged at intervals along a second direction, and the first direction intersects the second direction;
  a bottom electrode plate configured to form the plate capacitor structure, where the bottom electrode plate includes a bottom electrode layer at least covering sidewalls of the support layers; and
  a dielectric plate configured to form the plate capacitor structure, where the dielectric plate includes a dielectric layer covering the bottom electrode layer.

Other aspects of the present disclosure are understandable upon reading and understanding of the accompanying drawings and detailed description.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
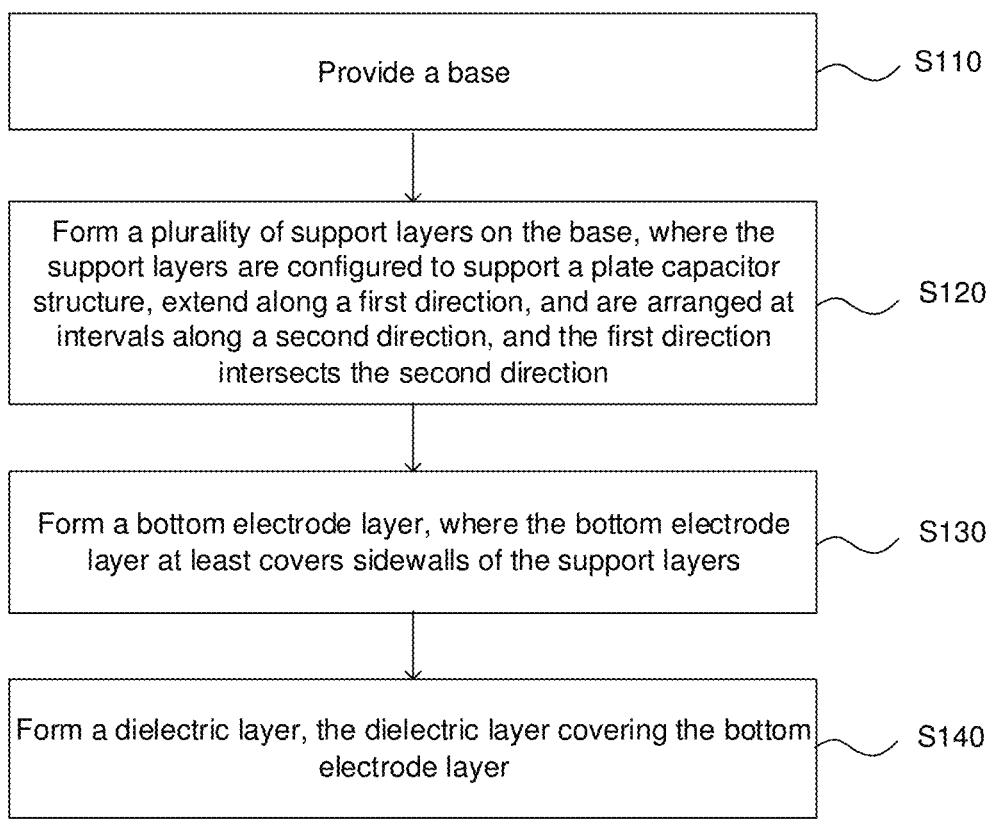
FIG. 1 is a flowchart of a method of manufacturing a semiconductor structure according to an exemplary embodiment.
Figure 2:
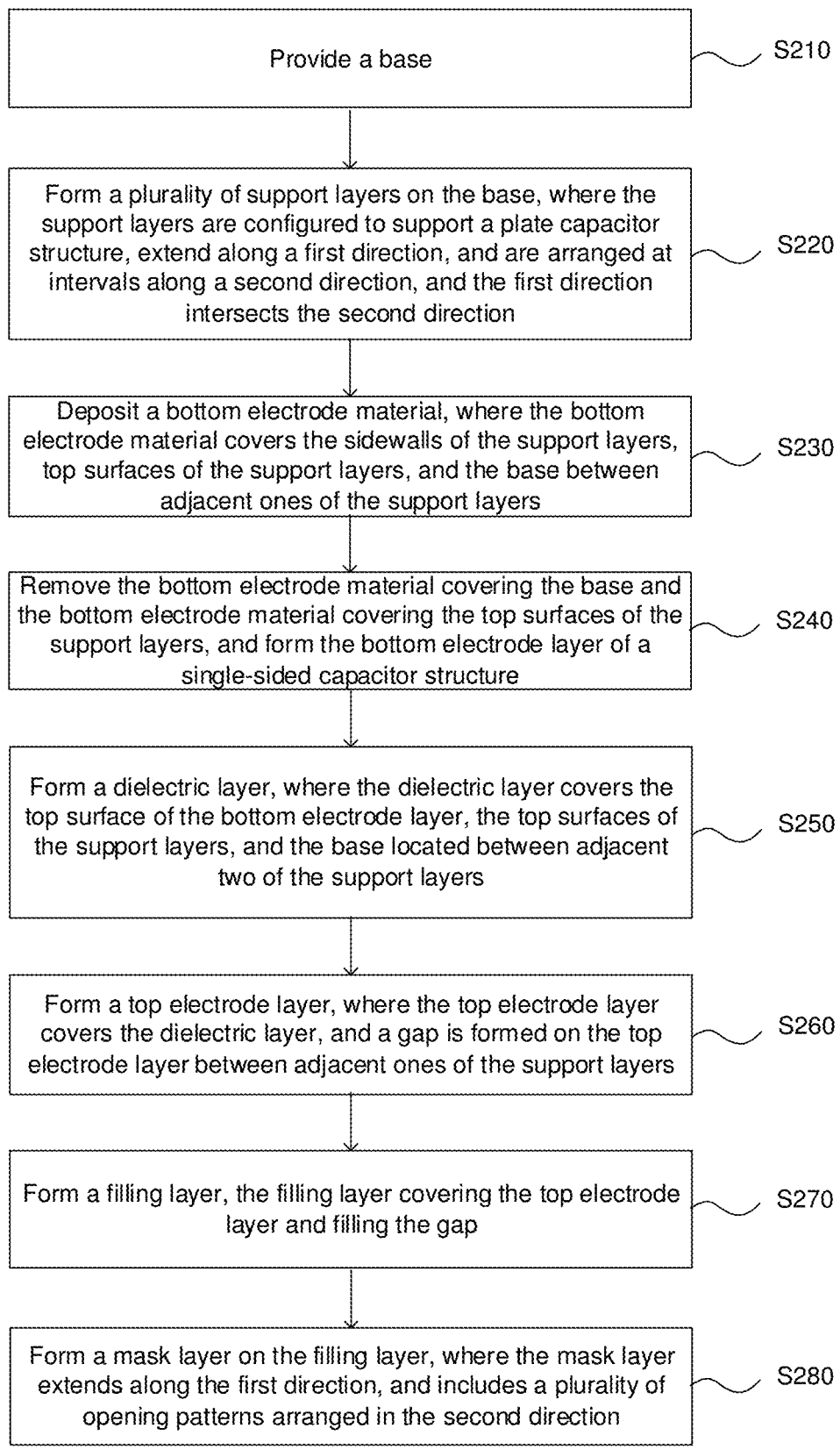
FIG. 2 is a flowchart of a method of manufacturing a semiconductor structure according to an exemplary embodiment.
Figure 3:
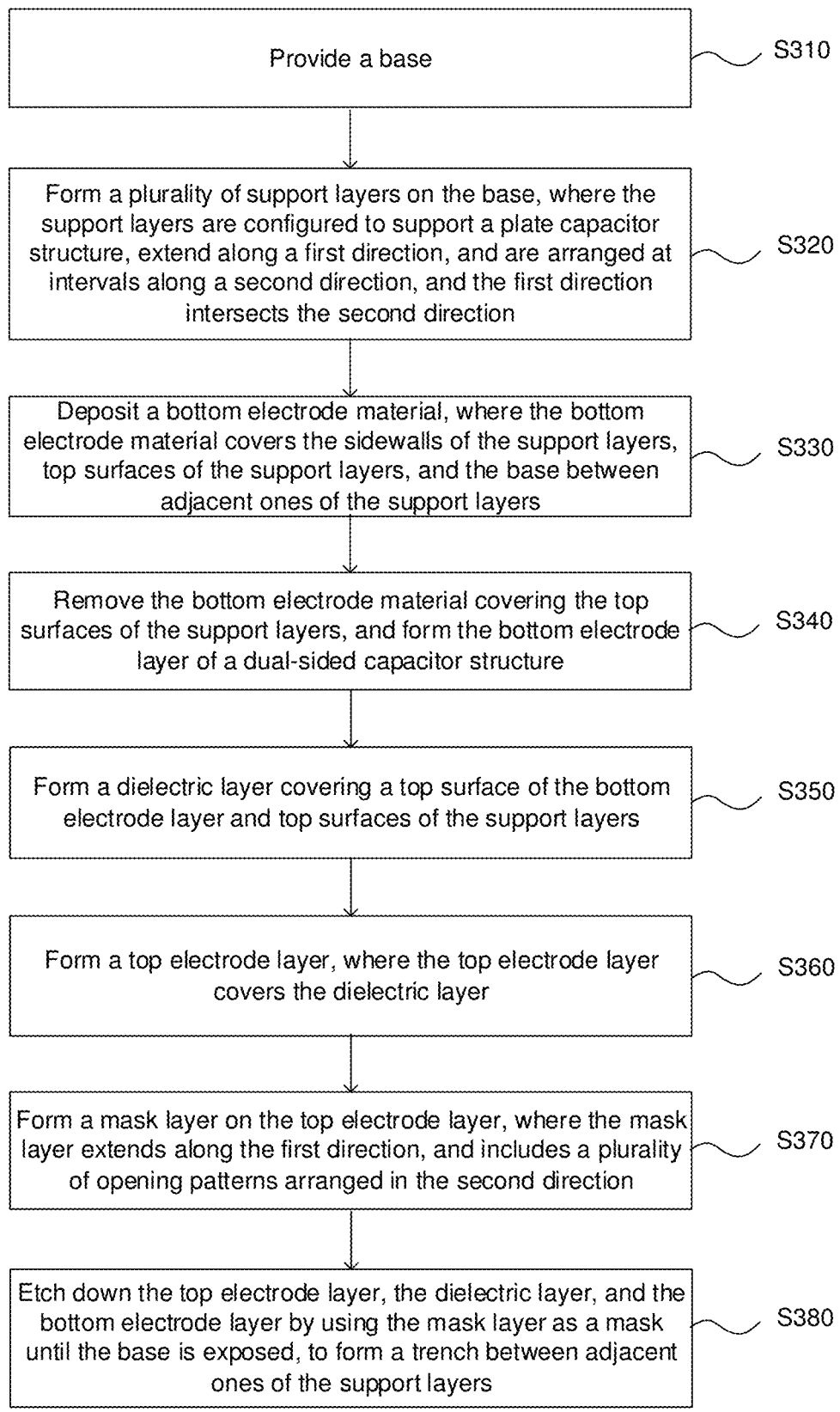
FIG. 3 is a flowchart of a method of manufacturing a semiconductor structure according to an exemplary embodiment.

In view of this, exemplary embodiments of the present disclosure provide a method of manufacturing a semiconductor structure. FIGS. 1 to 3 are flowcharts of the method of manufacturing a semiconductor structure according to exemplary embodiments of the present disclosure. FIGS. 4 to 23 are schematic diagrams of the method of manufacturing a semiconductor structure at various stages. The method of manufacturing a semiconductor structure is described below with reference to FIGS. 4 to 23.

The semiconductor structure is not limited in this embodiment. Description is made by using the semiconductor structure as a plate capacitor structure, but this embodiment is not limited thereto, and the semiconductor structure in this embodiment may further be another structure. It should be understood that, the semiconductor structure formed in this embodiment does not constitute an integrated capacitor. This embodiment is merely a forming process of a capacitor.

As shown in FIG. 1, the method in this embodiment includes:

Step S110: Provide a base.

Figure 4:
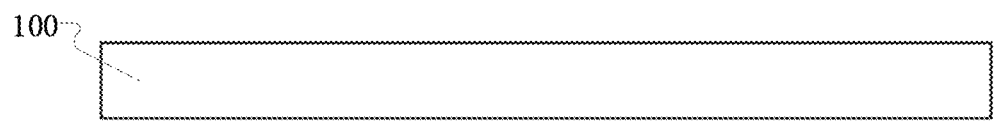
FIG. 4 is a cross-sectional view of a base in a method of manufacturing a semiconductor structure according to an exemplary embodiment.

As shown in FIG. 4, the base 100 may include a semiconductor material. The semiconductor material may include one or more selected from the group of silicon, germanium, a silicon-germanium compound, and a silicon-carbon compound. For example, the base 100 may be a silicon-on-insulator (SOI) base or a is germanium-on-insulator (GOI) base. In other embodiments, the base 100 may further include insulating materials such as silicon oxide or silicon nitride. The base 100 further includes structures such as buried word lines, shallow trench isolation structures, active regions, and bit lines (not shown in the figure).

Step S120: Form a plurality of support layers on the base, where the support layers are configured to support a plate capacitor structure, extend along a first direction, and are arranged at intervals along a second direction, and the first direction intersects the second direction.

Figure 5:
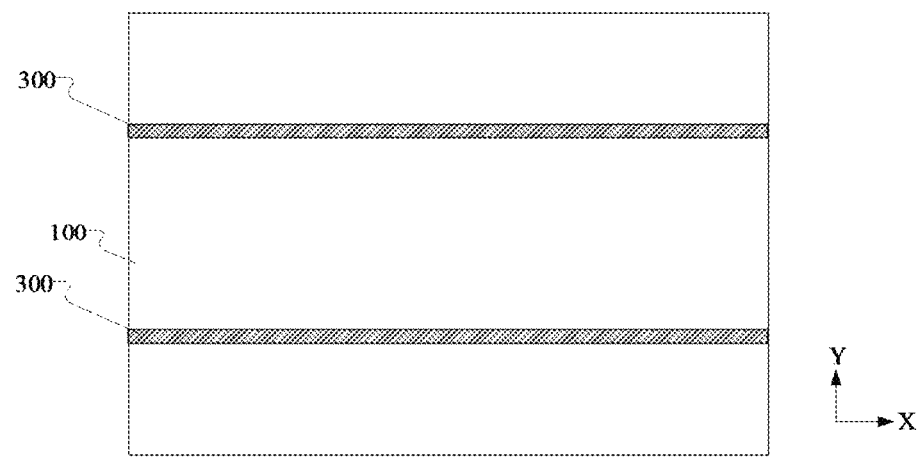
FIG. 5 is a top view of forming support layers on the base in the method of manufacturing a semiconductor structure according to an exemplary embodiment.

As shown in FIG. 5, the support layers 300 may be deposited on the base 100 by using an atomic layer deposition process (ALD) process or a chemical vapor deposition process (CVD), and then are taken as capacitor supports. The support layer 300 extends along the first direction X, and the first direction X may be a direction parallel to the base 100, and the support layers 300 are arranged independently at intervals in the second direction Y. The second direction Y may be a direction parallel to the base 100 and intersecting the surface of the support layer 300. The first direction X intersects the second direction Y to form a preset angle, which may be, for example, 45 degrees, 60 degrees, or 90 degrees. The support layer 300 is connected to the base 100, and in the second direction Y, two side surfaces of the support layer 300 expose a partial the surface of the base 100.

Figure 6:
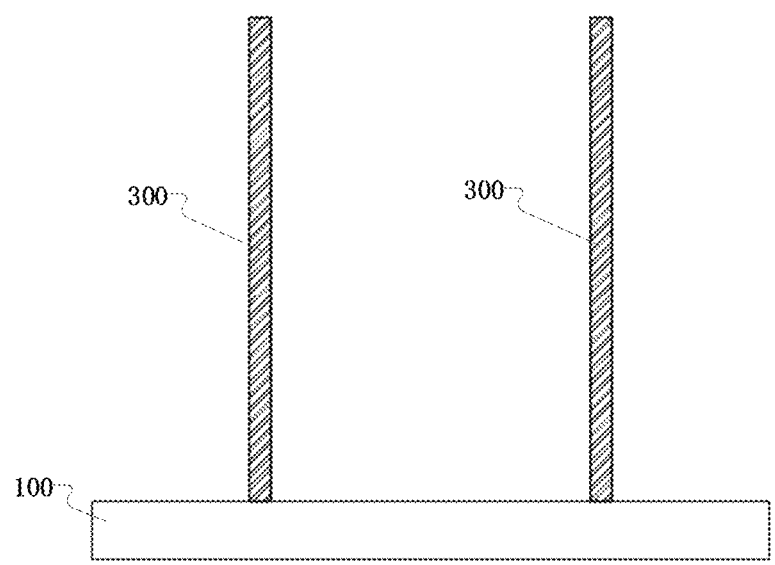
FIG. 6 is a cross-sectional view of forming planar support layers on the base in the method of manufacturing a semiconductor structure according to an exemplary embodiment.
Figure 7:
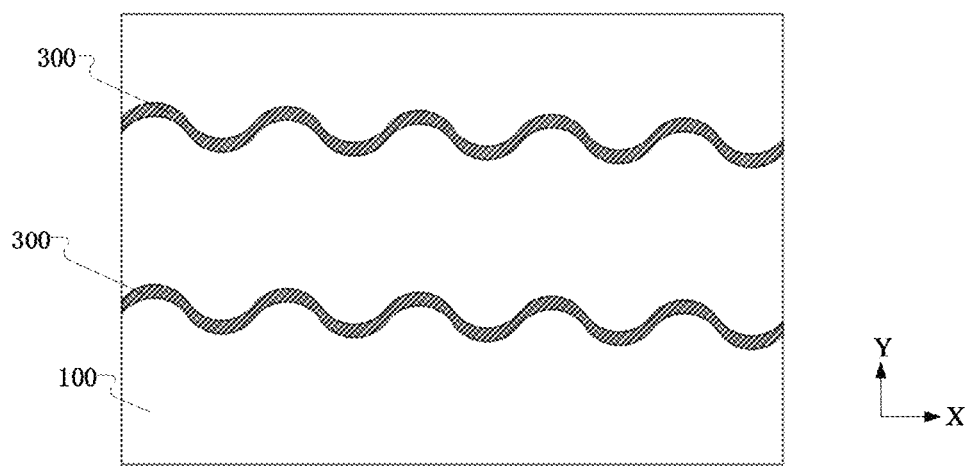
FIG. 7 is a top view of forming curved support layers on the base in the method of manufacturing a semiconductor structure according to an exemplary embodiment.

In an exemplary implementation, as shown in FIGS. 5 and 7, the side surfaces of the support layer 300 may be planes or curved surfaces. As shown in FIG. 6, in the direction perpendicular to the base 100, the side surfaces of the support layer are planes, and on a surface perpendicular to the base 100, side surfaces of the support layer 300 are parallel to each other. The height and width of the support layer 300 may be set according to the storage density of the capacitor structure. The support layer 300 may extend by a predetermined length in the first direction and two adjacent support layers may be spaced by a predetermined distance. The height and width of the support layer may further be set according to the storage density of the semiconductor structure. This is not limited particularly herein. The material of the support layer 300 may be an insulating material with a specific hardness such as silicon nitride or silicon oxynitride, and the support layer may be a support composed of a single-layer film or a multi-layer film.

Step S130: Form a bottom electrode layer, where the bottom electrode layer at least covers sidewalls of the support layers.

Figure 8:
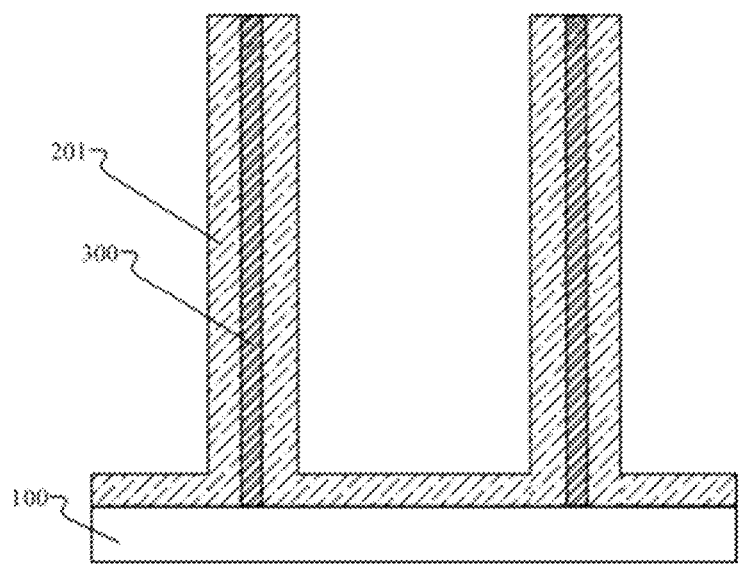
FIG. 8 is a cross-sectional view of forming a bottom electrode layer in the method of manufacturing a semiconductor structure according to an exemplary embodiment.
Figure 9:
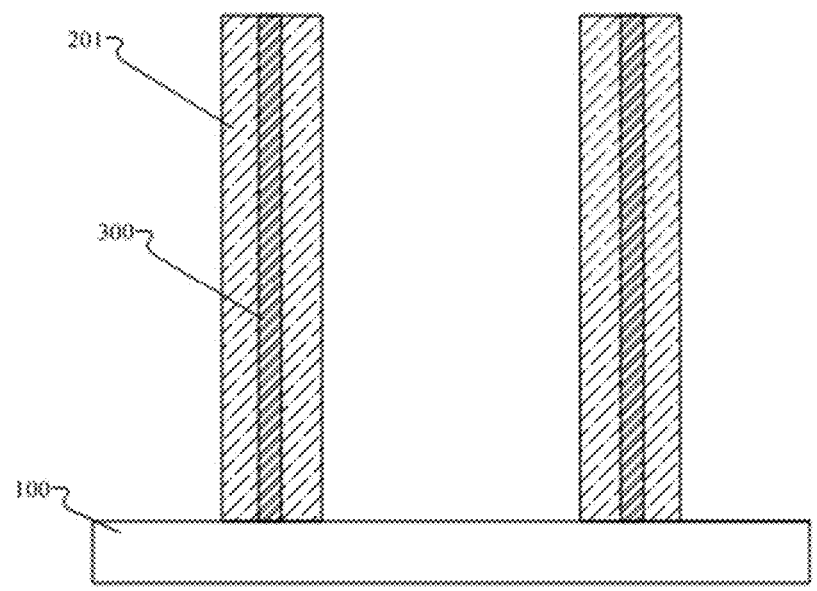
FIG. 9 is a cross-sectional view of forming a bottom electrode layer in the method of manufacturing a semiconductor structure according to an exemplary embodiment.

As shown in FIG. 8, the ALD process or the CVD process may be used to deposit a bottom electrode material layer on at least the sidewalls of the support layers 300 to form a bottom electrode layer 201. In FIG. 8, the bottom electrode layer 201 covers the sidewall surfaces of the support layers 300 and the base 100 between two adjacent support layers 300 to form the bottom electrode layer 201. As shown in FIG. 9, the bottom electrode layer 201 covers the sidewall surfaces of the support layers 300 to form the bottom electrode layer 201. The material of the bottom electrode layer 201 may be different from the material of the support layer 300. The material of the bottom electrode layer 201 includes, but is not limited to, one or a combination of titanium nitride (TiN), metal titanium (Ti), metal molybdenum (Mo), molybdenum nitride (MoN), metal ruthenium (Ru), and ruthenium nitride (RuN).

When the single-sided plate capacitor structure is formed, as shown in FIG. 9, the bottom electrode layer 201 covers the sidewall surfaces at two sides of the support layer 300. When the dual-sided plate capacitor structure is formed, as shown in FIG. 8, the bottom electrode layer 201 covers the sidewall surfaces of the support layer 300 and the base 100 between two adjacent support layers 300.

Step S140: Form a dielectric layer, the dielectric layer covering the bottom electrode layer.

Figure 10:
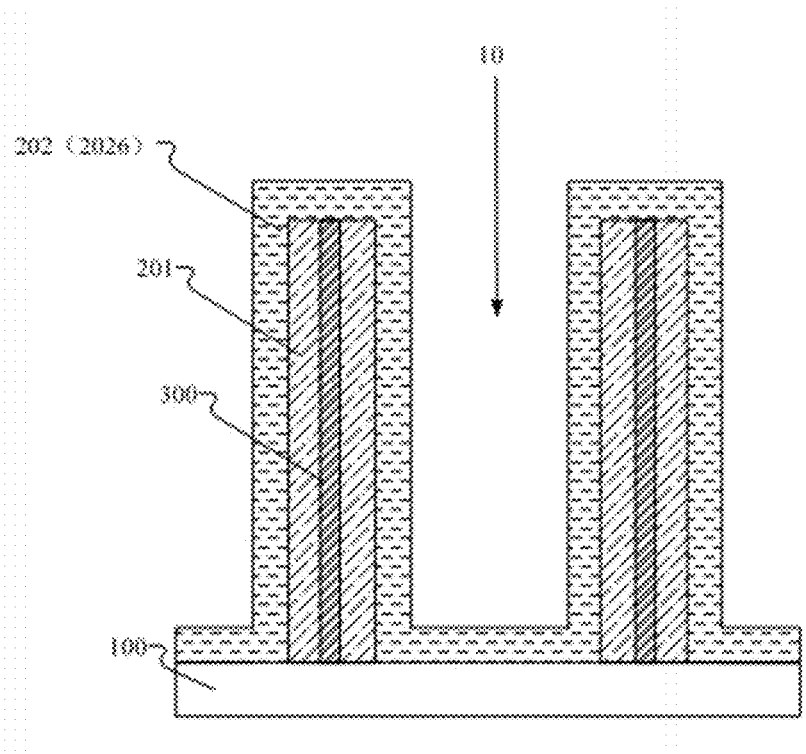
FIG. 10 is a cross-sectional view of forming a dielectric layer in the method of manufacturing a semiconductor structure according to an exemplary embodiment.
Figure 19:
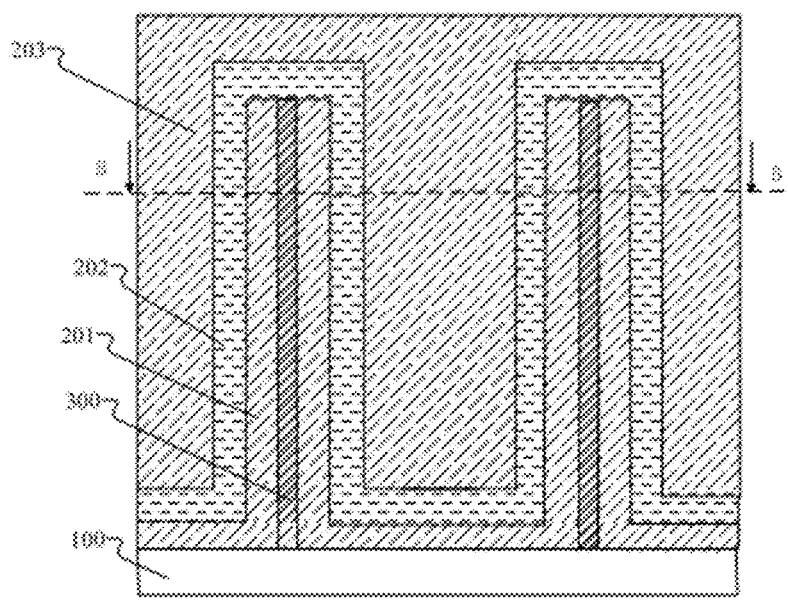
FIG. 19 is a cross-sectional view of forming a top electrode layer in the method of manufacturing a semiconductor structure according to an exemplary embodiment.

After the bottom electrode layer 201 is formed, a dielectric layer 202 is formed on the bottom electrode layer 201, that is, the dielectric layer 202 covers the bottom electrode layer 201. When the single-sided plate capacitor structure is formed, as shown in FIG. 10, the dielectric layer 202 is deposited on a top surface of the bottom electrode layer 201, the top surfaces of the support layers 300, and the upper surface of the base 100 exposed between the support layers 300. When a dual-sided plate capacitor structure is formed, as shown in FIG. 19, a dielectric layer 202 is deposited on the top surfaces of the support layers 300 and the bottom electrode layer 201, and the dielectric layer 202 may be of a single-layer film structure or a multi-layer film structure.

In the method of manufacturing a semiconductor structure of this embodiment, as shown in FIG. 10, the plurality of support layers 300 are formed on the base 100, and the bottom electrode layer 201 and the dielectric layer 202 are at least formed on sidewalls of the support layers 300. The support layer 300 is configured to support the capacitor of the plate structure, and the columnar capacitor is improved into a plate capacitor, thereby reducing the filling aspect ratio of the capacitor and preventing the problem of delamination and uneven filling at the bottom of the capacitor.

According to an exemplary embodiment of the present disclosure, this embodiment is a further description of step S140 in the foregoing embodiment. The dielectric layer 202 may be of a single-layer structure or a multi-layer structure. The forming the dielectric layer 202 includes:

forming a first material layer, where the first material layer covers the bottom electrode layer, the top surfaces of the support layers, and the base between adjacent ones of the support layers.

At least one first material layer forms the dielectric layer.

In the process of forming the dielectric layer in this embodiment, the method for forming the dielectric layer is exemplarily described by using a two-layer structure as an example.

Step S241: Form a first material layer 2026, where the first material layer 2026 covers the bottom electrode layer 201, the top surfaces of the support layers 300, and the base 100 between adjacent ones of the support layers.

As shown in FIG. 10, the ALD process or the CVD process may be used to deposit a first material on the top surface of the bottom electrode layer 201, the top surfaces of the support layers 300, and the upper surface of the exposed base 100, to form the first material layer 2026. The first material layer 2026 covers the top surface of the bottom electrode layer 201, the top surfaces of the support layers 300, and the upper surface of the exposed base 100. In this case, the first material layer 2026 is taken as the dielectric layer 202.

Step S242: Form a second material layer, where the second material layer covers the first material layer, and the first material layer and the second material form the is dielectric layer.

Figure 11:
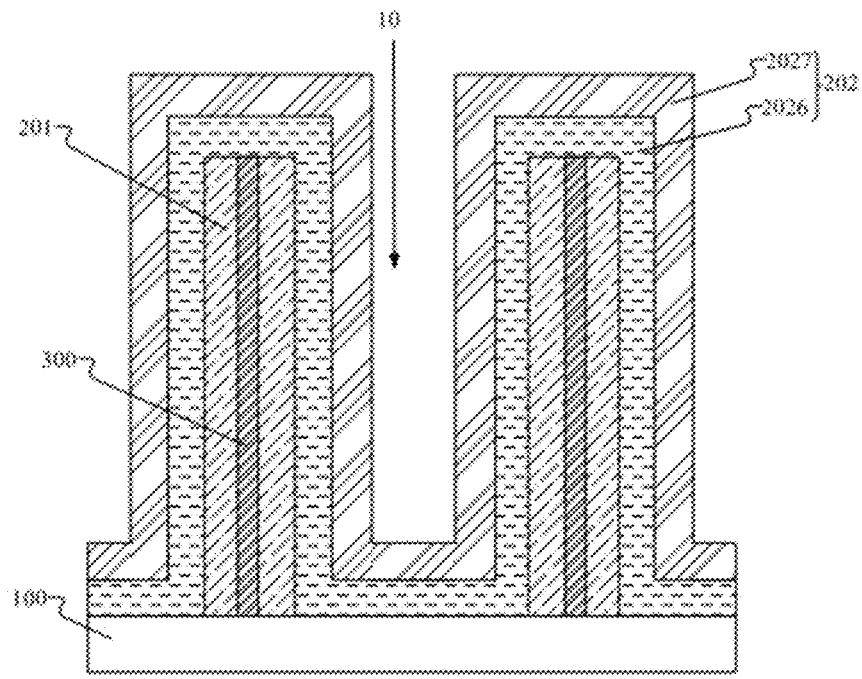
FIG. 11 is a cross-sectional view of forming a dielectric layer in the method of manufacturing a semiconductor structure according to an exemplary embodiment.

As shown in FIG. 10, the first material layer 2026 can be formed by depositing the first material to form the dielectric layer 202 of a single-layer film structure. As shown in FIG. 11, the dielectric layer 202 may be of a multi-layer film structure. After one first material layer 2026 is formed, the material may be deposited continuously on the surface of the first material layer 2026 to form a second material layer 2027. The first material layer 2026 and the second material layer 2027 form the dielectric layer 202 of the multi-layer film structure. For example, the second material layer 2027 and the first material layer 2026 may be made of different materials or the same material. When the material of the second material layer 2027 and the material of the first material layer 2026 are the same, the dielectric layer 202 of the multi-layer film structure is of a one-layer structure. When the material of the second material layer 2027 and the material of the first material layer 2026 are different, the dielectric layer 202 of the multi-layer film structure is of a two-layer structure. In FIG. 11, for the convenience of illustration, the first material layer 2026 and the second material layer 2027 are shown as a two-layer structure, but this does not limit the structure layer of the dielectric layer 202. Certainly, the dielectric layer may include more layers, such as 3 layers, 4 layers, or 6 layers. In other embodiments, the multi-layer material layer may be formed repeatedly according to the thickness of the dielectric layer 202 to form the dielectric layer 202 of the multi-layer film structure. The materials of the multi-layer material layer may be the same or different.

In an exemplary implementation, as shown in FIG. 11, the first material layer 2026 and the second material layer 2027 may be made of a high-K dielectric material, for example, one or a combination of titanium oxide (TiO), hafnium oxide (HfO), niobium oxide (NbO), and indium gallium zinc oxide (InGaZnO). For example, the first material layer 2026 is a TiO layer, and the second material layer 2027 may be an HfO layer.

The solutions illustrated in FIGS. 10 and 11 are illustrations of forming, for example, a single-sided plate capacitor structure 200. When the dual-sided plate capacitor structure 400 is formed, the bottom electrode layer 201 covers the base 100 between the support layers, and the dielectric layer 202 is formed on the top surfaces of the bottom electrode layer 201 and the support layers 300. As shown in FIG. 19, the dielectric layer 202 may is further be formed into a single-film structure or a multi-film structure according to the methods shown in FIG. 10 and FIG. 11.

In the method of manufacturing a semiconductor structure in this embodiment, the columnar capacitor is improved into a plate capacitor. Because the plate structure capacitor supported by the support layers has a smaller storage area than the columnar structure capacitor, materials within the above range are selected as the dielectric layer materials, such that the storage capacity of the semiconductor structure can be improved.

According to an exemplary embodiment, in the method of manufacturing a semiconductor structure provided in this embodiment, this embodiment is described by taking the capacitor structure of the semiconductor structure as the single-sided plate capacitor structure. In this embodiment, as shown in FIG. 2, the method of manufacturing a semiconductor structure includes:

Step S210: Provide a base.

Step S220: Form a plurality of support layers on the base, where the support layers are configured to support a plate capacitor structure, extend along a first direction, and are arranged at intervals along a second direction, and the first direction intersects the second direction.

Steps S210 to S220 of this embodiment are implemented in the same manner as steps S110 to S120 of the foregoing embodiment, and are not be described in detail again herein.

Step S230: Deposit a bottom electrode material, where the bottom electrode material covers the sidewalls of the support layers, top surfaces of the support layers, and the base between adjacent ones of the support layers.

The ALD process or the CVD process may be used to deposit the bottom electrode material on the sidewalls of the support layers 300, the top surfaces of the support layers 300, and the surface of the base 100 between adjacent two of the support layers 300. In this embodiment, the bottom electrode material includes one or a combination of TiN, metal Ti, metal Mo, MoN, metal Ru, and RuN.

Step S240: Remove the bottom electrode material covering the base and the bottom electrode material covering the top surfaces of the support layers, and form the bottom electrode layer of a single-sided capacitor structure.

As shown in FIG. 9, the bottom electrode material covering the top surfaces of the support layers 300 and the surface of the base 100 is removed, and bottom electrode layers 201 are formed at two side surfaces of each of the support layers 300. The support layer 300 is configured to support the bottom electrode layer 201 of a single-sided plate capacitor structure, to prepare the formation of the single-sided plate capacitor structure.

In this embodiment, the bottom electrode material covering the top surfaces of the support layers 300 and the surface of the base 100 may be removed through dry etching or wet etching.

Step S250: Form a dielectric layer, where the dielectric layer covers the top surface of the bottom electrode layer, the top surfaces of the support layers, and the base located between adjacent two of the support layers.

As shown in FIG. 10, the dielectric layer 202 covers the bottom electrode layer 201, the top surfaces of the support layers 300, and the base 100 located between two adjacent support layers 300. The specific deposition manner is the same as the implementation of step S140 in the foregoing embodiment. Details are not described again herein.

Step S260: Form a top electrode layer, where the top electrode layer covers the dielectric layer, and a gap is formed on the top electrode layer between adjacent ones of the support layers.

Figure 12:
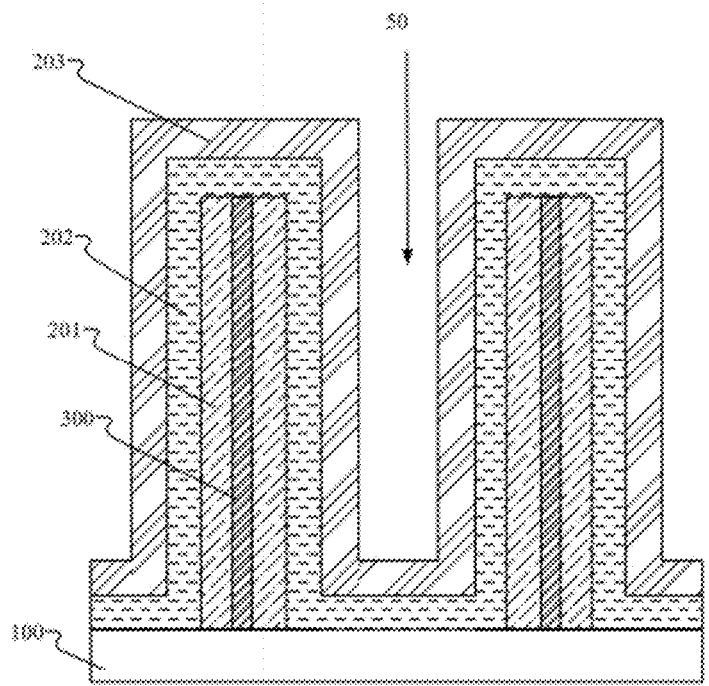
FIG. 12 is a cross-sectional view of forming a top electrode layer in the method of manufacturing a semiconductor structure according to an exemplary embodiment.

As shown in FIG. 10 or FIG. 11, above the base 100, a first gap 10 is formed on the dielectric layer 202 between two adjacent support layers 300. The dielectric layer 202 covers the top surfaces of the support layers 300 and the base 100 between the bottom electrode layer 201 and the support layer 300 to form the first gap 10 between the support layers. As shown in FIG. 12, the top electrode material is deposited on the outer surface of the dielectric layer 202 to form the top electrode layer 203. In the first gap 10 between two adjacent support layers 300, a second gap 50 is formed on the top electrode plate 203 on the dielectric layer 202. In this embodiment, the top electrode material and the bottom electrode material may be the same or different. The top electrode material includes one or a combination of TiN, metal Ti, metal Mo, MoN, metal Ru, and RuN.

Step S270: Form a filling layer, the filling layer covering the top electrode layer and filling the gap.

Figure 13:
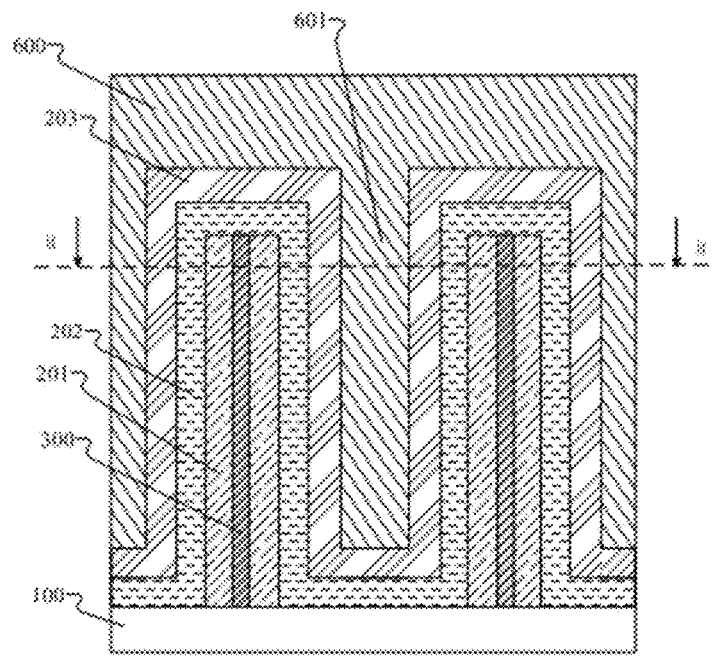
FIG. 13 is a cross-sectional view of forming a filling layer in the method of manufacturing a semiconductor structure according to an exemplary embodiment.

As shown in FIG. 13, a filling layer 600 is deposited on the outer surface of the top electrode layer 203, the filling layer 600 covers the outer surface of the top electrode layer 203, and the first part 601 of the filling layer 600 fills the gap 50.

The bottom electrode layer 201 covers both side surfaces of each of the support layers 300. The dielectric layer 202 covers the top surfaces of the support layers 300, the surface of the bottom electrode layer 201, and the base 100 between the support layers 300. The top electrode layer 203 covers the surface of the dielectric layer 202. In the initially formed single-sided plate capacitor structure, the bottom electrodes 201 are arranged at two sides of the support layer 300 respectively and are not connected to each other. The dielectric layer 202 covers the top surface of the bottom electrode 201, the top surfaces of the support layers 300, and the base 100 between the support layers. The top electrode layer 203 covers the dielectric layer 202, and the filling layer covers the dielectric layer 202 to form an initial plate capacitor structure.

Step S280: Form a mask layer on the filling layer, where the mask layer extends along the first direction, and includes a plurality of opening patterns arranged in the second direction.

Figure 14:
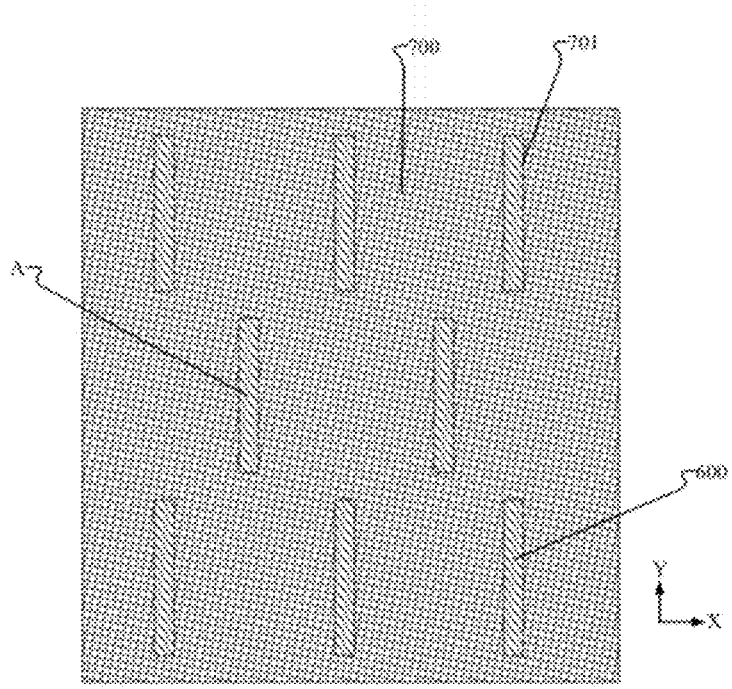
FIG. 14 is a top view of forming a mask layer in the method of manufacturing a semiconductor structure according to an exemplary embodiment.

As shown in FIG. 14, a mask layer 700 may be formed on the surface of the filling layer 600 through processes such as spin coating, development, and exposure. The mask layer 700 extends along the first direction X, such that the projection contour of the mask layer 700 on the base 100 coincides with the contour of the base 100. A plurality of opening patterns 701 are provided on the mask layer 700, and the opening patterns 701 extend along the second direction Y. As shown in FIG. 14, for example, a schematic diagram of the distribution of the opening patterns 701 on the mask layer 700 is shown. The opening patterns 701 are arranged at intervals in the first direction X, and are staggered in the second direction Y. The opening pattern 701 exposes a partial surface of the filling layer 600. The opening pattern 701 is distributed between the support layer 300 and the filling layer 600 that are adjacent to each other, that is, between the support layer 300 and the first part 601 of the filling layer 600 that are adjacent to each other.

Figure 15:
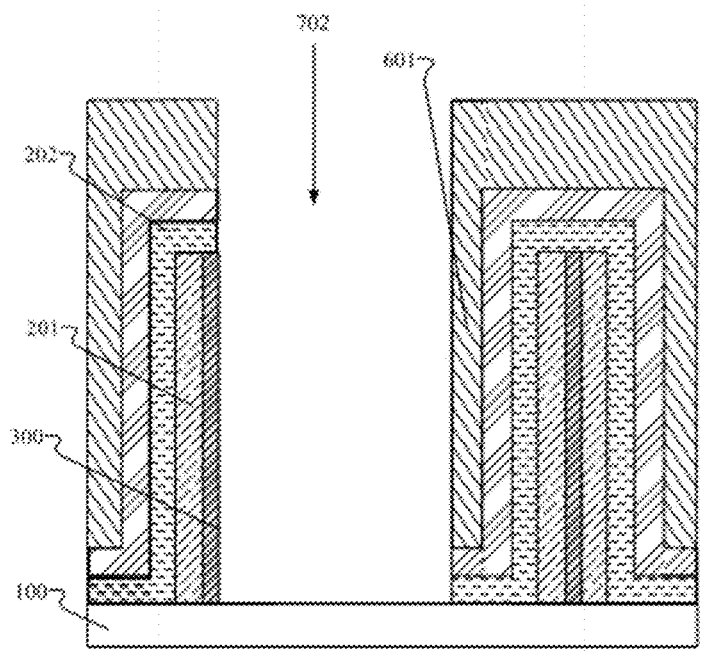
FIG. 15 is a cross-sectional view of a structure corresponding to a trench formed through etching downward based on an opening pattern marked with A in FIG. 14.

Step S290: Etch down the filling layer, the top electrode layer, and the dielectric layer by using the mask layer as a mask until the base is exposed, to form trenches between the filling layer and the support layer. As shown in FIG. 14, the mask layer 700 is used as a mask to sequentially etch a part of the filling layer 600, the top electrode layer 203, and the dielectric layer 202 downwards along the opening pattern 701, until a part of the top surface of the base 100 is exposed, to form a plurality of trenches 702, where the trench 702 is located between the support layer 300 and the filling layer 600. FIG. 15 is a cross-sectional view of a structure corresponding to the trench 702 formed through etching downward based on the opening pattern 701 marked with A in FIG. 14. The trench 702 penetrates through the filling layer 600, the top electrode layer 203, and the dielectric layer 202 sequentially, exposing a part of the top surface of the base 100. The trench 702 is located between the support layer 300 and the first part 601 of the filling layer 600. The width of the trench 702 is equal to the spacing between the support layer 300 and the first part 601 of the filling layer 600 that are adjacent to each other. The projection of the opening pattern 701 on the filling layer 600 may cover a part of the first part 601 of the filling layer 600, that is, the etching can be performed downwards based on the opening pattern 701 to remove a part of the first part 601, to form the trench 702. The width of the trench 702 is greater than the spacing between the support layer 300 and the first part 601 and smaller than the sum of the spacing between the support layer 300 and the first part 601 and the thickness of the first part 601.

Figure 16:
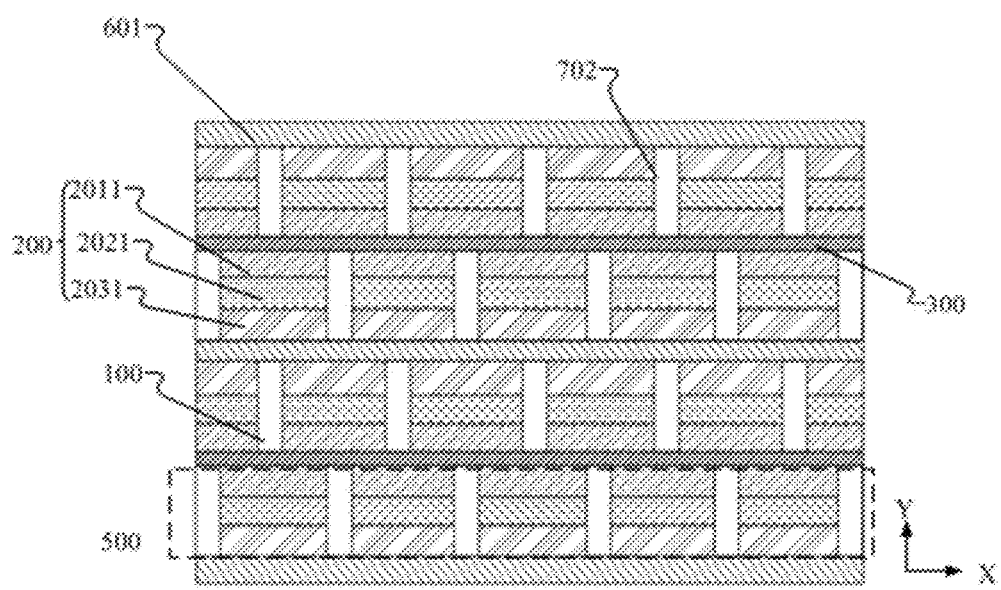
FIG. 16 is a cross-sectional view of a structure taken along a direction BB in FIG. 13.

The trenches 702 separate the initial capacitor structure into a plurality of independent single-sided plate capacitor structures 200 between the support layer 300 and the first part 601 of the filling layer 600. FIG. 16 is a cross-sectional view of a structure taken along a direction BB in FIG. 13. The independent single-sided plate capacitor structures 200 are separated by the trenches 702, the support layers 300, and the first parts 601 of the filling layers 600. Each single-sided plate capacitor structure 200 includes a bottom electrode plate 2011 formed by the retained bottom electrode layer 201, a dielectric plate 2021 formed by the retained dielectric layer 202, and the top electrode plate 2031 formed by the retained top electrode layer 203. The bottom electrode layers 201 are disposed at two sides of the support layer 300 and are not connected to each is other, and the bottom electrode layer 201 does not cover the base between the support layers 300. Therefore, the single-sided plate capacitor structures separated by the support layers 300, the first parts 601 of the filling layers 600, and the trenches 702 are independent of each other, and are disposed at two sides of the support layers 300.

These independent single-sided plate capacitor structures 200 are arranged at intervals in the first direction X and form a capacitor group 500 at one side of the support layer 300, such that the capacitor group 500 can be formed correspondingly for each support layer 300. With reference to FIG. 16, two rows of capacitor groups 500 between two adjacent support layers 300 are spaced apart by the first part 601 of the filling layer 600.

Each single-sided plate capacitor structure 200 includes the bottom electrode plate 2011, the dielectric plate 2021, and the top electrode plate 2031.

Figure 17:
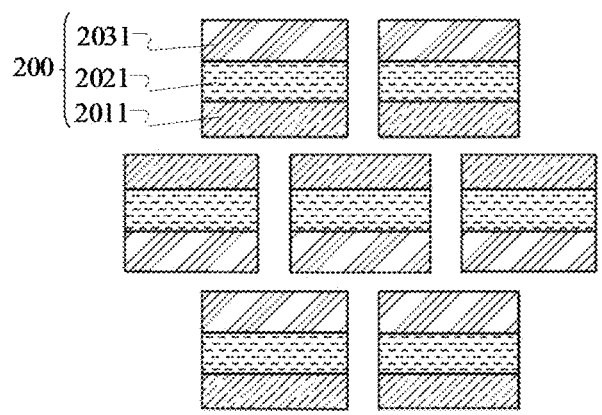
FIG. 17 is a schematic distribution diagram of a plurality of hexagonal closest-packed single-sided plate capacitor structures in the method of manufacturing a semiconductor structure according to an exemplary embodiment.

To improve space utilization and make full use of the capacitor material on the base to form more independent capacitor structures, as shown in FIG. 14 and FIG. 16, independent capacitor structures packed in a hexagonal manner may be formed on the base 100 based on the position of the opening patterns 701 of the mask layer 700, and the length of the opening pattern 701 is controlled between the filling layer 600 and the support layer 300. Alternatively, to achieve the objective, the width of the mask layer 700 may be controlled. The trench 702 is formed through etching along the opening pattern 701 to separate the capacitor structure into pieces distributed in a hexagonal closest-packed manner. FIG. 17 shows the hexagonal closest-packed distribution of the independent single-sided capacitor structures 200.

In this embodiment, the independent capacitor structures are distributed in a hexagonal closest-packed manner on the base, such that the space is effectively used to form more independent capacitor structures, and the space utilization rate is improved, thereby improving the storage density of the semiconductor.

Figure 18:
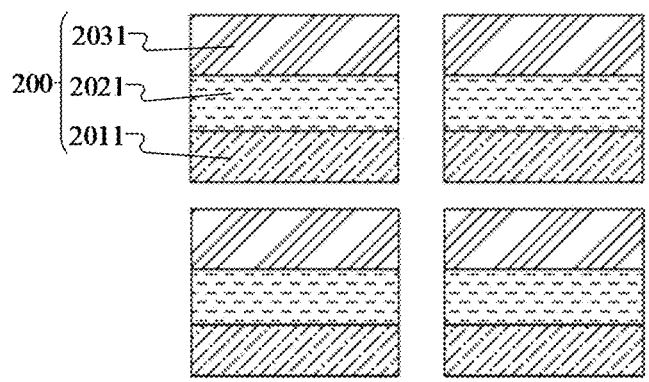
FIG. 18 is a schematic distribution diagram of a plurality of tetragonal-packed single-sided plate capacitor structures in the method of manufacturing a semiconductor structure according to an exemplary embodiment.

In an exemplary implementation, the opening patterns 701 are arranged at intervals in the first direction X, while in the second direction Y, adjacent opening patterns 701 may further be aligned and arranged. The trenches 702 are formed through etching along the opening pattern 701, and the independent single-sided capacitor structures 200 separated by the trenches 702 are distributed in a tetragonal packing manner. For example, FIG. 18 shows the tetragonal packing distribution of independent single-sided capacitor structures 200.

An isolation material may fill the trenches 702 to electrically isolate the capacitor structures that are independent of each other.

In this embodiment, after the independent capacitor structures are formed, the method further includes: removing the mask layer.

According to an exemplary embodiment, in the method of manufacturing a semiconductor structure provided in this embodiment, this embodiment is described by taking the capacitor of the semiconductor structure as a dual-sided capacitor. In this embodiment, as shown in FIG. 3, the method of manufacturing a semiconductor structure includes:

Step S310: Provide a base.

Step S320. Form a plurality of support layers on the base, where the support layers are configured to support a plate capacitor structure, extend along a first direction, and are arranged at intervals along a second direction, and the first direction intersects the second direction.

Step S330: Deposit a bottom electrode material, where the bottom electrode material covers the sidewalls of the support layers, top surfaces of the support layers, and the base between adjacent ones of the support layers.

Step S340: Remove the bottom electrode material covering the top surfaces of the support layers, and form the bottom electrode layer of a dual-sided capacitor structure.

Step S350: Form a dielectric layer covering a top surface of the bottom electrode layer and top surfaces of the support layers.

Step S360: Form a top electrode layer, where the top electrode layer covers the dielectric layer.

Steps S310 to S330 of this embodiment and Steps S210 to S230 of the foregoing embodiment are implemented in the same manner. Details are not repeated herein.

In step S340, with reference to FIG. 8, the bottom electrode material covering the top surfaces of the support layers 300 may be removed through an etching process, so as to disconnect the bottom electrode material on the support layer 300, such that independent bottom electrode layers are formed at two sides of the support layer 300 to prepare the subsequent formation of the dual-sided capacitor structure. In this embodiment, the top surface of the bottom electrode material is flush with the top surface of the support layer 300.

As shown in FIG. 19, in steps S350 and S360, the dielectric layer 202 covers the top surface of the bottom electrode layer 201 and the top surfaces of the support layers 300, and the top electrode layer 203 covers the dielectric layer 202. The top electrode layer 203 fills the gap between the dielectric layers 202. As shown in FIG. 19, the top electrode layer fills a space between the dielectric layers 202 between two adjacent support layers 300. In the initially formed dual-sided plate capacitor structure, the bottom electrode layers 201 are respectively disposed at two sides of each of the support layers 300 and on the base between two adjacent support layers 300, and are not connected to each other. The dielectric layer 202 covers the top surface of the bottom electrode layer 201 and the top surfaces of the support layers 300, and the top electrode layer 203 covers the dielectric layer 202 and fills the gap of the dielectric layer 202 between two adjacent support layers 300 to form an initial plate capacitor structure.

Step S370: Form a mask layer on the top electrode layer, where the mask layer extends along the first direction, and includes a plurality of opening patterns arranged in the second direction.

Figure 20:
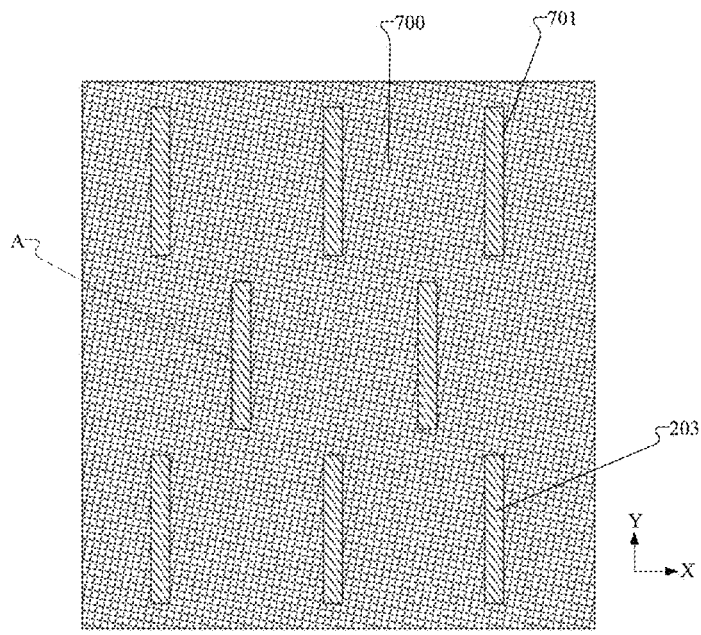
FIG. 20 is a top view of forming a mask layer in the method of manufacturing a semiconductor structure according to an exemplary embodiment.

To separate the initial capacitor structure into independent single-sided capacitor structures, as shown in FIG. 20, the mask layer 700 extends along the first direction X, and the mask layer 700 includes a plurality of opening patterns 701 arranged along the second direction Y. The plurality of opening patterns 701 are arranged at intervals in the first direction X, and are staggered in the second direction Y. The mask layer 700 covers the top electrode 203, and the opening pattern 701 exposes a part of the surface of the top electrode 203. The opening pattern 701 is distributed between two adjacent support layers 300.

Step S380: Etch down the top electrode layer, the dielectric layer, and the bottom electrode layer by using the mask layer as a mask until the base is exposed, to form is trenches between adjacent ones of the support layers.

Figure 21:
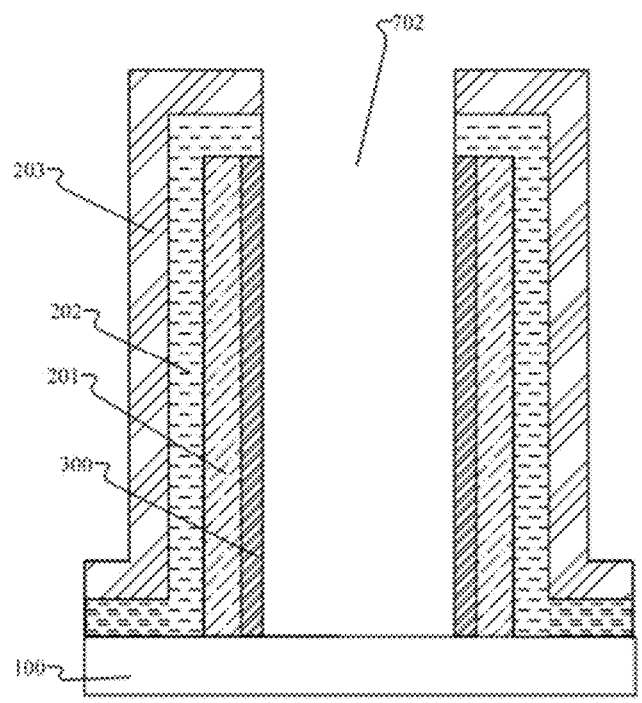
FIG. 21 is a cross-sectional view of a structure corresponding to a trench formed through etching downward based on an opening pattern marked with A in FIG. 19.

As shown in FIGS. 20 and 21, the mask layer 700 is used as a mask to sequentially etch the top electrode layer 203, the dielectric layer 202, and the bottom electrode layer 201 downwards along the opening pattern 701, until a part of the top surface of the base 100 is exposed, to form a plurality of trenches 702, where the trench 702 is located between two adjacent support layers 300. FIG. 21 is a cross-sectional view of a structure corresponding to the trench 702 formed through etching downward based on an opening pattern 701 marked with A in FIG. 19. The trench 702 penetrates the top electrode layer 203, the dielectric layer 202, and the bottom electrode layer 201 sequentially, exposing a part of the top surface of the base 100, where the width of the trench is limited by a distance between two adjacent support layers.

Figure 22:
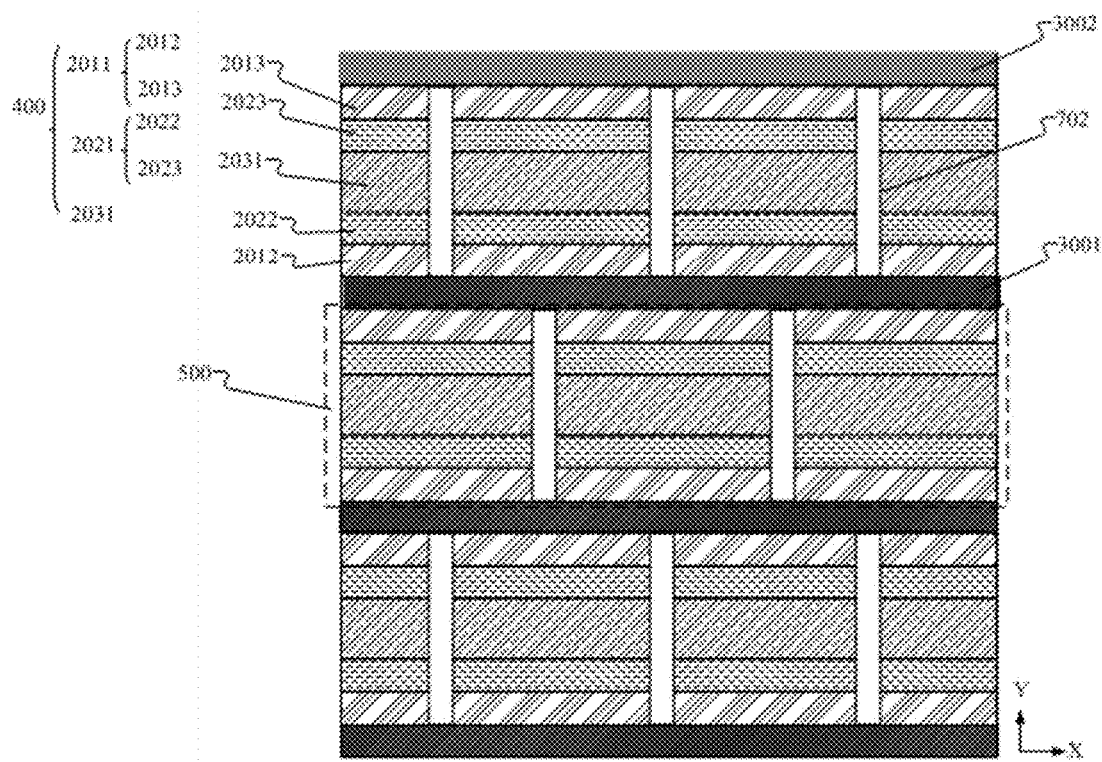
FIG. 22 is a cross-sectional view of a structure taken along a direction BB in FIG. 19.

FIG. 22 is a cross-sectional view of a structure taken along a direction BB in FIG. 19. The trenches 702 separate the initial capacitor structure into a plurality of independent dual-sided plate capacitor structures 400 between two adjacent support layers. The independent dual-sided plate capacitor structures 400 are separated by the trenches 702 and adjacent support layers. Each dual-sided plate capacitor structure 400 includes a bottom electrode plate 2011 formed by the retained bottom electrode layer 201, a dielectric plate 2021 formed by the retained dielectric layer 202, and the top electrode plate 2031 formed by the retained top electrode layer 203. The bottom electrode plate 2011 includes a first bottom electrode plate 2012 formed by the retained bottom electrode layer 201 on the first support layer 3001, the retained second bottom electrode plate (not shown) on the base 100, and the third bottom electrode plate 2013 formed by the retained bottom electrode layer 201 on the first support layer 3002. The dielectric plate 2021 includes a first dielectric plate 2022 located on the first bottom electrode plate 2012, a second dielectric plate (not shown) located on the second bottom electrode plate, and a third dielectric plate 2023 on the third bottom electrode plate 2013.

Each dual-sided plate capacitor structure 400 includes a first bottom electrode plate 2012, a second bottom electrode plate, a third bottom electrode plate 2013, a first dielectric plate 2022, a second dielectric plate, a third dielectric plate 2023, and a top electrode plate 2031. The first bottom electrode plate 2012 and the third bottom electrode is plate 2013 are located at two sides of the top electrode plate 2031, and the first dielectric plate 2022 and the third dielectric plate 2023 are located at two sides of the top electrode plate 2031, to form a dual-sided plate capacitor structure.

Because the top electrode layer 203 covers the dielectric layer 202, when the dual-sided plate capacitor structure is formed, the trenches 702 do not separate the top electrode layer, and the dual-sided plate capacitor structures share the top electrode plate 2031 formed by the top electrode layer 203.

These independent dual-sided plate capacitor structures 400 are arranged at intervals between two adjacent support layers in the first direction X to form a capacitor group 500. Because the top electrode layer 203 fills the gap between the dielectric layers 202 and covers the dielectric layer 202, when the trench 702 is formed, the top electrode layer 203 is not cut off and is kept integrated. In this way, in the dual-sided plate capacitor structure, independent dual-sided plate capacitor structures share the top electrode plate 2031.

Figure 23:
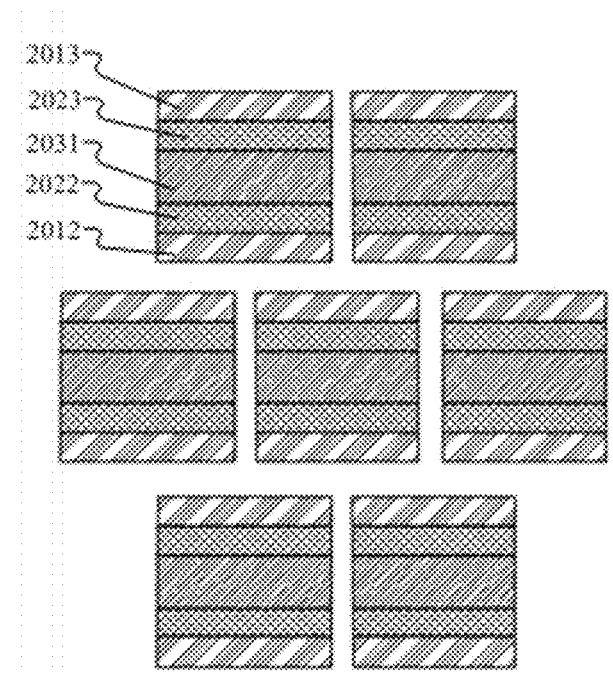
FIG. 23 is a schematic distribution diagram of a plurality of hexagonal closest-packed dual-sided plate capacitor structures in the method of manufacturing a semiconductor structure according to an exemplary embodiment.

As shown in FIGS. 22 and 23, to improve the space utilization, and make full use of the capacitor material on the base to form more independent dual-sided plate capacitor structures 400, independent capacitor structures packed in a hexagonal manner may be formed on the base 100 based on the position of the opening patterns 701 of the mask layer 700. FIG. 22 shows the hexagonal closest-packed distribution of these independent dual-sided plate capacitor structures 400.

Figure 24:
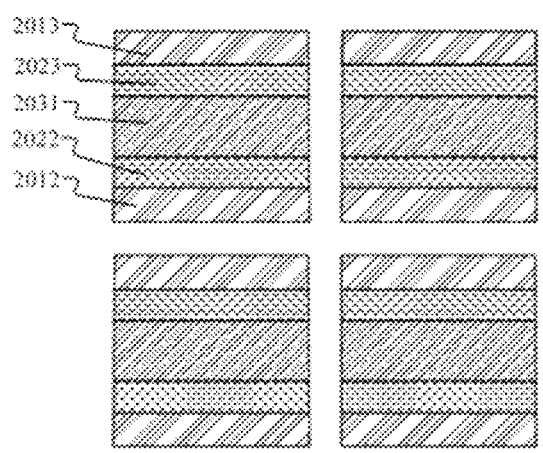
FIG. 24 is a schematic distribution diagram of a plurality of tetragonal-packed dual-sided plate capacitor structures in the method of manufacturing a semiconductor structure according to an exemplary embodiment.

In this embodiment, the independent dual-sided plate capacitor structures are distributed in a hexagonal closest-packed manner on the base, such that the space is effectively used to form more independent capacitor structures, and the space utilization rate is improved, thereby improving the storage density of the semiconductor. In another exemplary embodiment of the present disclosure, dual-sided capacitor structures packed in a tetragonal manner may also be formed. For example, FIG. 24 shows the tetragonal packing distribution of the dual-sided plate capacitor structures 400.

According to an exemplary embodiment, as shown in FIG. 7, the side surfaces of the support layer 300 formed on the base 100 are curved surfaces, such as wavy curved surfaces. If the side surfaces of two adjacent support layers are curved surfaces, taking is a plane parallel to the second direction Y of the base 100 as a cross section, in the first direction X parallel to the base 100, distances between curved surfaces of two adjacent support layers are kept the same, such that widths between the two curved surfaces of the two adjacent support layers 300 are equal, to avoid different widths of the trenches in the middle caused by inconsistent curved surfaces when the side surfaces of the support layer are curved surfaces. Otherwise, the trenches are connected locally in a subsequent formation process of the filling material, and thus the semiconductor structure is affected. For the structure formed, reference may be made to the corresponding schematic structural diagram in which the side surface of the support layer is a plane. If the support layer is a curved surface, the contact area of the formed plate capacitor structure is larger, and the storage capacity is larger.

An exemplary embodiment of the present disclosure provides a semiconductor structure. As shown in FIGS. 16 and 22, the semiconductor structure includes: a base 100; a plurality of support layers 300 that are configured to support a plate capacitor structure on the base 100, where the support layers 300 extend along a first direction X, and are arranged at intervals along a second direction Y, and the first direction X intersects the second direction Y; a bottom electrode plate 2011 configured to form the plate capacitor structure, where the bottom electrode plate 2011 includes a bottom electrode layer at least covering a sidewall of the support layer 300; and a dielectric plate 2021 configured to form the plate capacitor structure, where the dielectric plate 2021 includes a dielectric layer covering the bottom electrode layer.

The semiconductor structure provided in this exemplary embodiment of the present disclosure further includes: a top electrode plate 2031 configured to form the plate capacitor structure, where the top electrode plate 2031 includes a top electrode layer covering the dielectric layer.

When the plate capacitor structure is a single-sided plate capacitor structure, the semiconductor structure further includes a filling plate 602 configured to form the plate capacitor structure, where the filling plate 602 includes a filling layer covering the top electrode layer.

The plate capacitor structure may include a plurality of independent single-sided plate capacitor structures 200. These independent single-sided plate capacitor structures 200 are disposed on the support layer along the first direction. Any two adjacent single-sided plate capacitor structures 200 are separated by a trench 702. The trench 702 is located between the filling plate 602 and the support layer 300. In the process of forming the single-sided plate capacitor structure 200, the bottom electrode layer 201 does not cover a gap between two adjacent support layers 300. When the trench 702 is formed between the support layer 300 and a first part 601 of the filling layer 600, each single-sided plate capacitor structure 200 is isolated by the support layer 300, the first part 601 of the filling layer 600, and the trench

702. In this way, single-sided plate capacitor structures 200 that are independent of each other can be formed.

The plate capacitor structure may further include a plurality of independent dual-sided plate capacitor structures 400. The independent dual-sided plate capacitor structures 400 are disposed on the support layer along the first direction. Any two adjacent plate capacitor structures are isolated by the trench 702. The trench is located between the support layers. The independent plate capacitor structures share the top electrode plate.

In the semiconductor structure in this embodiment, the independent support layers 300 are formed on the base 100, and the independent capacitor structures are formed on the support layer 300, such that the support layers 300 are configured to support the capacitor of a plate structure, thereby reducing the filling aspect ratio, and preventing delamination and uneven filling at the bottom of the capacitor. According to an exemplary embodiment, most content of the semiconductor structure in this embodiment is the same as the foregoing embodiment, and the differences between them are that, as shown in FIGS. 5 and 7, the side surfaces of the support layer are planes or curved surfaces; if the side surfaces of two adjacent support layers are planes, the two planes are parallel to each other; and if side surfaces of two adjacent support layers are curved surfaces, taking a plane in the second direction as a cross section, in the first direction, distances between the side surfaces of the two support layers are equal.

As shown in FIGS. 5 and 7, the side surfaces of the support layer 300 formed on the base 100 are planes or curved surfaces. The support layers of a plate structure or a is curved structure are configured to support a plate capacitor structure, thereby reducing the filling aspect ratio, and preventing delamination and uneven filling at the bottom of the capacitor. If the side surfaces of the support layer are curved surfaces, the formed capacitor has a larger contact area, and has a larger storage capacity.

The embodiments or implementations of this specification are described in a progressive manner, and each embodiment focuses on differences from other embodiments. The same or similar parts between the embodiments may refer to each other.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

The invention claimed is:

1. A method of manufacturing a semiconductor structure, comprising:
    providing a base;
    forming a plurality of support layers on the base, wherein the support layers are configured to support a plate capacitor structure, extend along a first direction, and are arranged at intervals along a second direction, and the first direction intersects the second direction;
    forming a bottom electrode layer, wherein the bottom electrode layer at least covers sidewalls of the support layers; and
    forming a dielectric layer, the dielectric layer covering the bottom electrode layer;
    forming a top electrode layer, the top electrode layer covering the dielectric layer;
    forming a mask layer on the top electrode layer, wherein the mask layer extends along the first direction, and comprises a plurality of opening patterns arranged in the second direction; and
    etching down the top electrode layer, the dielectric layer, and the bottom electrode layer by using the mask layer as a mask until the base is exposed, to form trenches between adjacent ones of the support layers.

2. The method of manufacturing a semiconductor structure according to claim 1, wherein the forming a bottom electrode layer comprises:
    depositing a bottom electrode material, wherein the bottom electrode material covers the sidewalls of the support layers, top surfaces of the support layers, and the base between adjacent ones of the support layers; and
    removing the bottom electrode material covering the top surfaces of the support layers, and forming the bottom electrode layer of a dual-sided capacitor structure.

3. The method of manufacturing a semiconductor structure according to claim 1, wherein the forming a bottom electrode layer comprises:
    depositing a bottom electrode material, wherein the bottom electrode material covers the sidewalls of the support layers, top surfaces of the support layers, and the base between adjacent ones of the support layers; and
    removing the bottom electrode material covering the base and the bottom electrode material covering the top surfaces of the support layers, and forming the bottom electrode layer of a single-sided capacitor structure.

4. The method of manufacturing a semiconductor structure according to claim 1, wherein the forming a dielectric layer comprises:
    forming a first material layer, wherein the first material layer covers the bottom electrode layer, top surfaces of the support layers, and the base between adjacent ones of the support layers; and
    at least one first material layer forms the dielectric layer.

5. The method of manufacturing a semiconductor structure according to claim 4, wherein a material of the first material layer comprises at least one dielectric material, and the dielectric material comprises one or more selected from the group of titanium oxide, hafnium oxide, niobium oxide, and indium gallium zinc oxide.

6. The method of manufacturing a semiconductor structure according to claim 1, further comprising:

a gap is formed on the top electrode layer between adjacent ones of the support layers; and forming a filling layer, the filling layer covering the top electrode layer and filling the gap.

7. The method of manufacturing a semiconductor structure according to claim 6, further comprising:

forming a mask layer on the filling layer, wherein the mask layer extends along the first direction, and comprises a plurality of opening patterns arranged in the second direction; and etching down the filling layer, the top electrode layer, and the dielectric layer by using the mask layer as a mask until the base is exposed, to form trenches between the filling layer and the support layer.

8. The method of manufacturing a semiconductor structure according to claim 1, wherein a side surface of the support layer is a plane or a curved surface;

when side surfaces of adjacent two of the support layers are planes, adjacent planes are parallel to each other; or when side surfaces of adjacent two of the support layers are curved surfaces, a plane in the second direction is taken as a cross section, and along the first direction, distances between adjacent curved surfaces on the cross section are equal.

* * * * *